United States Patent
Griswold et al.

(10) Patent No.: US 9,989,604 B2
(45) Date of Patent: Jun. 5, 2018

(54) MULTITURN MRI COILS IN COMBINATION WITH CURRENT MODE CLASS D AMPLIFIERS

(71) Applicant: Case Western Reserve University, Cleveland, OH (US)

(72) Inventors: Mark Griswold, Shaker Heights, OH (US); Natalia Gudino, Washington, DC (US)

(73) Assignee: Case Western Reserve University, Cleveland, OH (US)

( * ) Notice: Subject to any disclaimer, the term of this patent is extended or adjusted under 35 U.S.C. 154(b) by 1417 days.

(21) Appl. No.: 13/897,863

(22) Filed: May 20, 2013

(65) Prior Publication Data
US 2014/0176135 A1    Jun. 26, 2014

Related U.S. Application Data

(60) Provisional application No. 61/745,690, filed on Dec. 24, 2012.

(51) Int. Cl.
| | |
|---|---|
| G01R 33/38 | (2006.01) |
| G01R 33/36 | (2006.01) |
| G01R 33/561 | (2006.01) |
| G01R 33/3415 | (2006.01) |

(52) U.S. Cl.
CPC ..... G01R 33/3614 (2013.01); G01R 33/5612 (2013.01); *G01R 33/3415* (2013.01); *G01R 33/3607* (2013.01)

(58) Field of Classification Search
CPC ............ G01R 33/3614; G01R 33/5612; G01R 33/3415; G01R 33/3607; H03F 3/217

USPC .................................................. 324/318–322
See application file for complete search history.

(56) References Cited

U.S. PATENT DOCUMENTS

| | | | | |
|---|---|---|---|---|
| 5,646,530 | A * | 7/1997 | Strenk | G01R 33/3415 324/318 |
| 7,622,925 | B2 * | 11/2009 | Fujimoto | G01R 33/3415 324/309 |
| 7,671,595 | B2 * | 3/2010 | Griswold | G01R 33/3415 324/318 |
| 2005/0253582 | A1 * | 11/2005 | Giaquinto | G01R 33/3415 324/318 |

(Continued)

OTHER PUBLICATIONS

Gudino, Natalia, et al. "On-coil multiple channel transmit system based on class-D amplification and pre-amplification with current amplitude feedback." Magnetic resonance in medicine 70.1 (2012): 276-289.*

*Primary Examiner* — Rishi Patel
(74) *Attorney, Agent, or Firm* — Quarles & Brady LLP

(57) ABSTRACT

Example systems, apparatus, and circuits described herein concern a multi-turn transmit surface coil used in parallel transmission in high field MRI. One example apparatus includes a balun network that produces out-of-phase signals that are amplified to drive current-mode class-D (CMCD) field effect transistors (FETs) that are connected by a coil that includes an LC (inductance-capacitance) leg. The LC leg selectively alters the output analog RF signal and the analog RF signal is used in high field parallel magnetic resonance imaging (MRI) transmission. The multi-turn transmit surface coil produces an improved (e.g., stronger) B1 field without increasing heat dissipation.

21 Claims, 15 Drawing Sheets

(56) References Cited

U.S. PATENT DOCUMENTS

| | | | | |
|---|---|---|---|---|
| 2006/0186882 A1* | 8/2006 | Walsh | ................ | G01R 33/3415 |
| | | | | 324/309 |
| 2007/0282194 A1* | 12/2007 | Wiggins | ................ | A61B 5/055 |
| | | | | 600/422 |
| 2011/0241682 A1* | 10/2011 | Gudino | .............. | G01R 33/3614 |
| | | | | 324/318 |
| 2011/0241685 A1* | 10/2011 | Gudino | .................. | H03F 3/217 |
| | | | | 324/322 |
| 2012/0223706 A1* | 9/2012 | Hetherington | ... | G01R 33/34007 |
| | | | | 324/307 |
| 2014/0292327 A1* | 10/2014 | Griswold | .......... | G01R 33/3614 |
| | | | | 324/309 |

* cited by examiner

MULTITURN MRI COILS IN COMBINATION WITH CURRENT MODE CLASS D AMPLIFIERS

CROSS-REFERENCE TO RELATED APPLICATIONS

This application claims the benefit of U.S. Provisional Application 61/745,690 filed Dec. 24, 2012, by the same inventors.

BACKGROUND

Magnetic resonance imaging (MRI) involves the transmission of radio frequency (RF) energy. RF energy may be transmitted by a coil. Resulting magnetic resonance (MR) signals may also be received by a coil. An electromagnetic coil, which may also be referred to as a "coil", is formed when a conductor is wound around a core or form to create an inductor or electromagnet. The conductor may be, for example, a copper wire or trace. When electricity passes through the coil, it generates a magnetic field. One loop of a conductor may be referred to as a turn or a winding. A coil may include one or more turns. In early MRI, RF energy may have been transmitted from a single coil and resulting MR signals received by a single coil. Later, multiple receivers may have been used in parallel acquisition techniques. Using multiple receivers facilitates speeding up signal reception, which in turn may reduce scan time. Similarly, multiple transmitters may be used in parallel transmission techniques. Using multiple transmitters may facilitate speeding up a transmission process, which in turn may facilitate volumetric excitation, selective isolation, and other very high speed features.

Conventional systems may have been limited by their use of relatively low power (e.g., <50 W), low efficiency class A or class AB amplifiers. While some systems may have included on-coil series and/or shunt-fed class-D amplifiers, even these conventional systems have suffered from several limitations including inadequate detuning and low efficiency.

U.S. Pat. No. 7,671,595 ('595) issued to Griswold et al. on Mar. 2, 2010, which is entitled "On-coil Switched Mode Amplifier for Parallel Transmission in MRI" describes an on-coil current-mode class D ("CMCD") amplifier that may be used to produce MRI transmission-coil excitations at desired RF frequencies. The on-coil CMCD amplifier is capable of performing within or proximate to the bore of the MRI magnet or within less than one wavelength of the amplifier from the transmit coil. Providing an on-coil amplifier allows digital control signals to be sent to the coil assembly, improving synchronization between the transmission-coils while reducing interference, cross talk, physical space requirements associated with cables, and heating normally associated with parallel transmission MRI systems.

BRIEF DESCRIPTION OF THE DRAWINGS

The accompanying drawings, which are incorporated in and constitute a part of the specification, illustrate various example systems, methods, and other embodiments of various aspects of the invention. It will be appreciated that the illustrated element boundaries (e.g., boxes, groups of boxes, or other shapes) in the figures represent one example of the boundaries. One of ordinary skill in the art will appreciate that in some embodiments one element may be designed as multiple elements, multiple elements may be designed as one element, an element shown as an internal component of another element may be implemented as an external component and vice versa, and so on. Furthermore, elements may not be drawn to scale.

DETAILED DESCRIPTION

Figure 1:
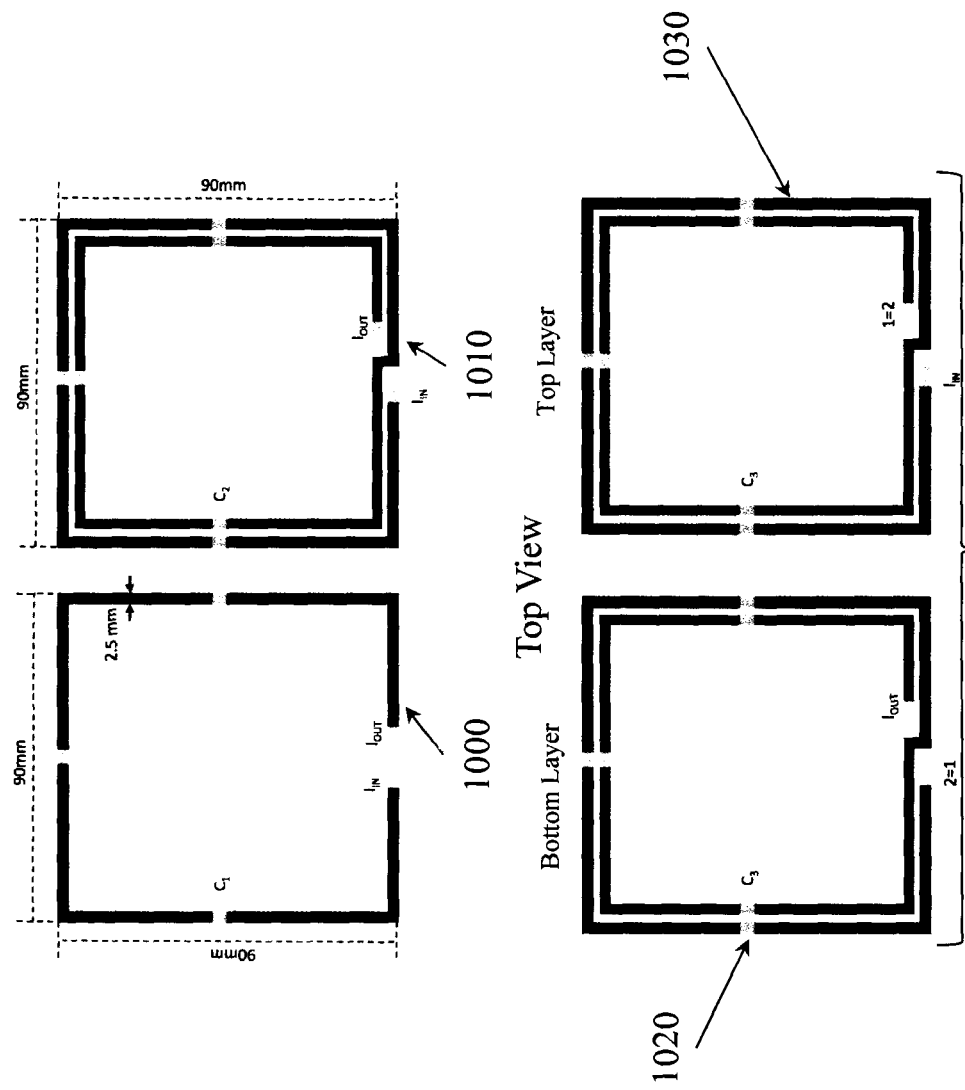
FIG. 1 illustrates layouts of different example coils: coil 1000 with one turn, coil 1010 with the same dimensions and two turns, and coil 1040 built as a two layer coil having the same dimensions as coil 1010 and four turns.

Multiple-turn surface coils are used infrequently in modern array coils since they generally offer reduced performance when used in a receive mode. However, a multi-turn transmit surface coil design can improve B1 efficiency per output current when used with current source amplification. An example coil was driven by an on-coil current mode class-D (CMCD) amplifier with current envelope feedback. The example multi-turn surface coil increased B1 amplitude by almost three-fold without increasing heat dissipation on the power device at the amplifier output. This gain in B1 was shown on the bench top and through imaging in a 1.5 T scanner. In addition to reduced heat dissipation per B1 in current MOSFETs, higher B1 per current efficiency facilitates the use of MOSFETs with lower drain current ratings and lower port capacitances, which in turn facilitates improving the overall performance of the on-coil current source transmit system.

Array coils are widely used in modern MRI practice. The number of array elements in array coils continues to increase. Some array coils have up to 128 elements for receiver coils and up to 64 elements for transmitters. Conventionally, transmit arrays directly control the B1 field achieved by current source amplification. Current source amplification produces load insensitivity and some level of amplifier decoupling. An on-coil CMCD with envelope feedback amplifier is an alternative design for the implementation of parallel transmitters. With the amplifier loaded with a 7Ω impedance, output power around 300 W RMS and peak current above 10 A was measured. These power and current ratings required the use of high current RF power MOSFETs at the output CMCD stage.

RF power MOSFETs have non-negligible voltage-modulated capacitances that increase with nominal power and have an effect on the amplifier performance. Drain-source capacitance, for example, had a direct effect on the amplifier decoupling as well as on the phase of the RF carrier. In general, a device with lower capacitance values across the whole range of operating drain voltages would result in improved overall system performance, but these devices normally come with reductions in the useable drain current. Since the target load is usually a fixed value, the choice of device is generally the only available variable in this optimization problem.

Conventionally, the use of multiple-turn surface coils is rare in modern array coils, since multiple-turn surface coils generally offer reduced performance when used in a receive mode at clinical field strengths. Example coils described herein include a transmit system where the on-coil CMCD amplifier with envelope feedback drives a multi-turn transmit surface loop. Since the current-mode devices directly drive current into the load and not voltage across a load, the coil geometry can be exploited to increase the amplitude of the transmit field per current value (B1/I). Both bench top and scanner tests proved a gain in B1 when increasing the number of turns at the same output current and heat dissipation without any modification to the amplifier unit. This coil design, together with the presented amplifier topology, facilitates implementing optimized multiple-channel transmit systems.

FIG. 1 illustrates three different coils: a single-turn coil 1000, a two-turn coil 1010 with both turns printed on one-layer 1.6 mm thick FR-4 board, and a four-turn coil 1040 printed on two-layer 1.6 mm thick FR-4 board. Coil 1040 includes a bottom layer 1020 and a top layer 1030. In one embodiment, the trace width was 2.5 mm, the space between turns was 1.4 mm and the outer dimension was 90 mm×90 mm. In other embodiments, other trace widths, spaces between turns, and outer dimensions may be used. One embodiment included setting three capacitors splitting per turn to resonate each coil at 63.66 MHz when loaded with a 2000 ml saline phantom. The input impedance for the three different coils (connected to a 25 cm cable with a 84 pF capacitor in series to resonate the cable and coil combined structure to 63.66 MHz at the amplifier terminals) was measured through a network analyzer (Agilent Technologies, E5061A) in both unloaded and loaded conditions.

Figure 2:
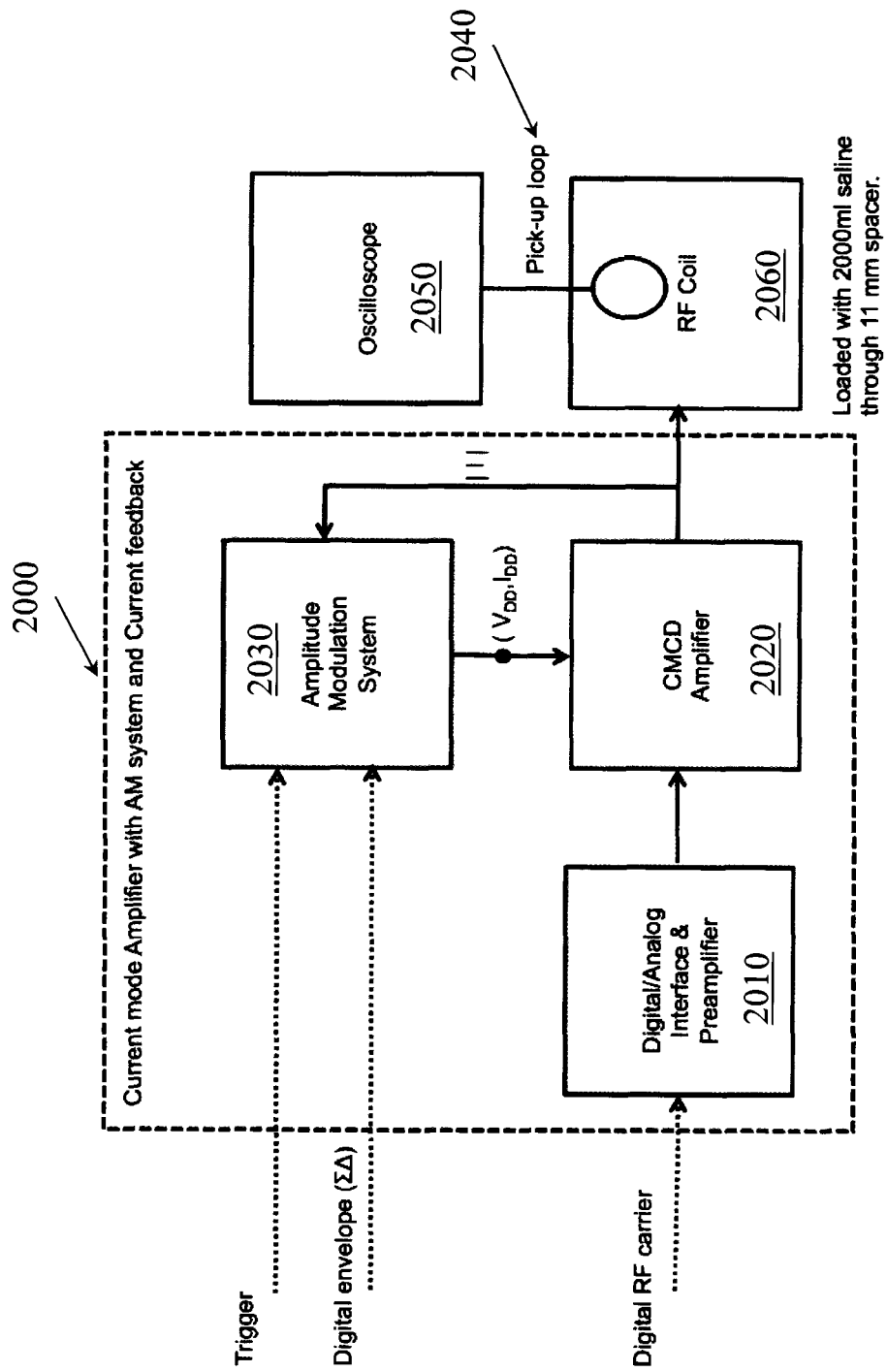
FIG. 2 illustrates equipment to measure the effect in B1 gain of different coils. Current was set by the control system independent of coil-load condition. Current input to the CMCD stage ($I_{DD}$) was set so that current in the coil was initially approximately 5 A peak for all load conditions.

The coils were connected to the same CMCD amplifier with envelope current feedback system 2000 as shown in FIG. 2. This amplifier system 2000 has three subsystems: a digital to analog interface and preamplifier 2010 that takes as input a digital encoded RF carrier and generates high enough voltage and current to switch the active devices on the output stages; a CMCD amplifier 2020 that has two power MOSFETs switched in a push-pull configuration at the RF carrier's frequency, and an amplitude modulation system 2030 that drives the supply voltage to the CMCD stage to track the RF envelope target signal through a closed-loop feedback with a current sensor located at the amplifier output. In one testing embodiment, the variable that sets the current amplitude at the output of the amplifier (digital encoded RF envelope ΣΔ) was kept at the same level for all the coils. The current on the coil for a given ΣΔ value was estimated from measurements of the input current to the CMCD stage ($I_{DD}$) from a differential voltage reading across a 0.1Ω (1% tolerance) shunt. Note that for the CMCD topology the input current is split in half due to the bridge configuration and the harmonics current are driven through an output resonant filter that is formed by the MOSFET's output capacitance in parallel with an external inductor. Thus at the RF bandwidth the input current behaves as a square signal and the current on the coil can be approximated as $$\hat{i}_{Coil} \sim \left(\frac{4}{\pi}\right)\frac{I_{DD}}{2} \qquad [2]$$

The observed output B1 field generated in the center of the coils was estimated by coupling a pick-up loop 2040 to the coil 2060 connected through a 20 dB attenuator connected to an oscilloscope 2050 (Agilent DSO7104B). The peak-to-peak voltage ($V_{pp}$) generated in the center of the coils was converted into the B1 field using a conversion factor of 6.4 µT/$V_{PP}$ as estimated based on $V_{PP}$ vs. output current curves, and coil geometry.

In one example, the distance from one coil to the load was changed to confirm that $V_{PP}$ (i.e., B1) was almost invariant to the corresponding load variations and that the system was working effectively as a current source. After confirmation, in a first setup, all coils were set at the same distance from the phantom through an 11 mm spacer. In a second embodiment, this distance was changed so that the loading to the amplifier from coil 1010 was similar to coil 1000 and so the load to coil 1040 was similar to coil 1010. Additionally, since heat dissipation is a consideration for the on-coil amplifier, the temperature on the MOSFET's case was measured with a fiber optic temperature sensor (OpSens L804-0083-05, −40° C. to 125° C., Canada). Following the same measurement methods, the gain in B1 was compared between coil 1000 and coil 1010 when driving 5 A and 10 A approximately.

To test different devices that can better exploit the increased B1/I gain, the MRF275G (M/A-COM semiconductor) was replaced by the MRF6V2010NR1 (Freescale) and then B1 was measured for three different output current values. For comparison, the output current values that generated similar B1 values previously acquired with the higher power setup were obtained. The output impedance of the amplifier in each of these configurations was measured. For the MRF275G, the resonant output filter was formed by an external inductor that resonates the output capacitance of the MOSFET when biased at 15 V. In the case of the MRF6V2010N, the filter was formed by a 51 μH external inductor and a 100 pF external capacitor in order to compensate for the low output capacitance of this device (<30 pF).

Finally, the different coils were tested in a 1.5 T scanner (Espree, Siemens, Germany), by connecting them to the same high power (MRF275G) amplifier unit through a BNC connector. The current-mode amplifier was used for transmission and the body coil was used for signal reception. Images for each design were acquired while keeping the same input value of RF envelope. Flip angle maps were obtained through the double angle method (DAM) using a GRE sequence with 2 ms RF pulse, 10 ms TE, 3 s TR, 20 cm×20 cm FOV and single average. Average flip angle and B1 values were calculated at the same 5-pixel region of interest (ROI) for each of the transmit coils.

Figure 3:
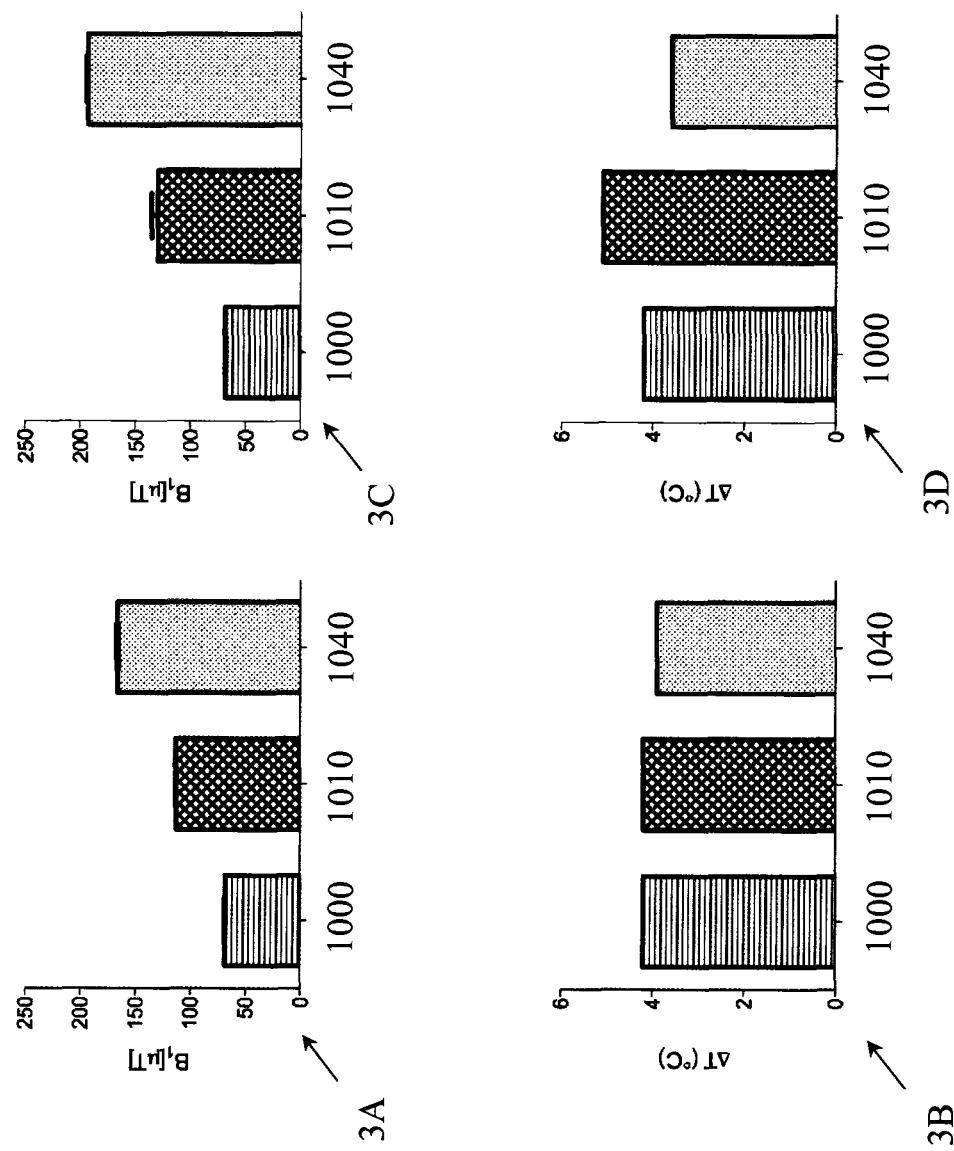
FIG. 3a illustrates the B1 field generated in the center of each coil at 5 A output current with coil-phantom distance set to 11 mm for all coils.
FIG. 3c illustrates the B1 field generated in the center of each coil with the coil-phantom distance modified such that coil 1010 had similar loading to coil 1000 (d=43 mm) and coil 1040 had similar loading to coil 1010 (d=36.5 mm).
FIGS. 3b and 3d illustrate the temperature increment measured on a MOSFET's (metal-oxide-semiconductor field-effect transistor) case after 5-minute continuous operation at 2% duty cycle to evaluate heat dissipation from the electronics.

Input impedances for the different coil designs are shown in table 1. The higher impedance unloaded was measured as expected due to the increased length of copper traces in the multi-turn design. These impedances are compensated with minimal or no effect on B1 amplitude through the direct drive of current. Independent of the loading conditions, the current setting for all experiments was such that peak current on the coil was close to 5A or 10A (Table 2). FIG. 3(a,b) shows the resulting B1 at the coil center, and temperature increment (ΔT) on power MOSFETs when driving approximately 5 A to all coils and with all coils at 11 mm distance from the phantom. At this current level, B1 was 1.7 higher for coil 1010 than coil 1000, and 1.5 higher for coil 1040 than coil 1010, resulting in a total gain of Bill of approximately 2.6 from coil 1000 to 1040 [FIG. 3(a)]. FIG. 3(b) shows that increased Bill was possible without increasing heat dissipation. For this amplifier topology, heat dissipation on the power device is dominated by $(I_{DD})^2 R_{DS\_ON}$, where $R_{DS\_ON}$ is the on-state resistance of the power MOSFET. Thus, for the current source operation, its value should be similar for all load conditions at a given envelope shape, amplitude and duty cycle. FIG. 3(c,d) shows the results when changing the coil-phantom distance so that the loading to the amplifier from coil 1010 is similar to coil 1000 and from coil 1040 to coil 1010. The gain in B1 was similar and approximately 1.9 higher for coil 1010 than coil 1000 and 1.5 higher for coil 1040 than coil 1010. FIG. 3(d) illustrates that the higher B1 amplitude did not significantly increase heat dissipation.

Figure 4:
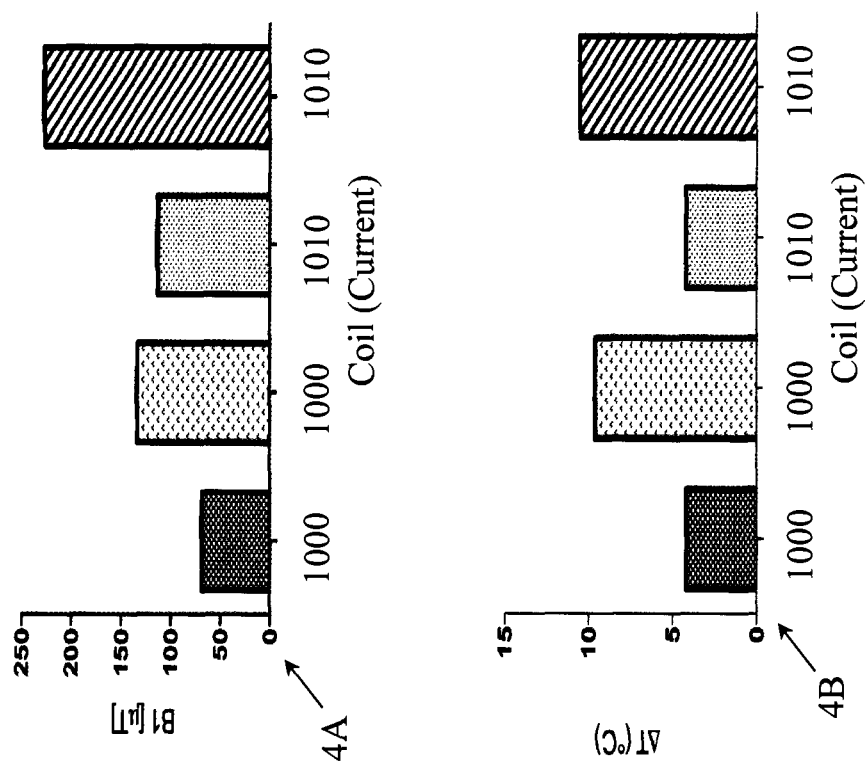
FIG. 4a illustrates the B1 field at the center of coil 1000 and coil 1010 at two different current levels (I~5 A and 2I~10 A).
FIG. 4b illustrates the temperature increment on the MOSFET's case.

FIG. 4 shows the result of driving coil 1000 and coil 1010 at two different current levels. Driving coil 1010 at 5A yielded a similar B1 as compared to driving coil 1000 at approximately 10 A, while at the same time, ΔT changed from 9.6° C. to 4.6° C. indicating a reduction in heat dissipation.

Figure 5:
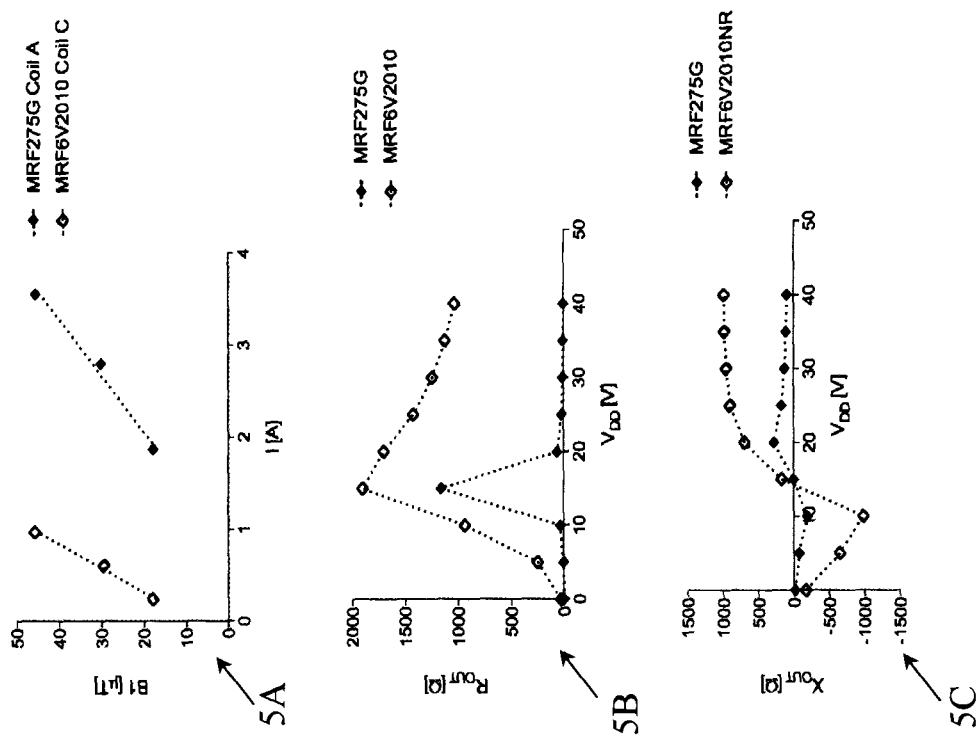
FIG. 5a illustrates B1 versus output current for a low power MOSFET (10 W, MRF6V2010, Freescale) connected to 4-turn coil (coil 1040, FIG. 1) and high power MOSFET (250 W, MRF275G, Maacom) connected to single-turn coil (coil 1000, FIG. 1).
FIG. 5b illustrates output resistance and FIG. 5c illustrates reactance versus drain voltage $V_{DD}$ for both MOSFETs.

Similar B1 values were possible at a lower current range for the lower power rated device connected to coil 1040 [FIG. 5(a)]. For this setup, B1 up to 45 μT at 1 A were possible. This is an approximately three-fold increase in B1/I when comparing with the MRF275G. FIG. 5(b) shows amplifier output impedance versus drain voltage for each setup. FIG. 5(c) shows reactance versus drain voltage $V_{DD}$ for both MOSFETs.

Figure 6:
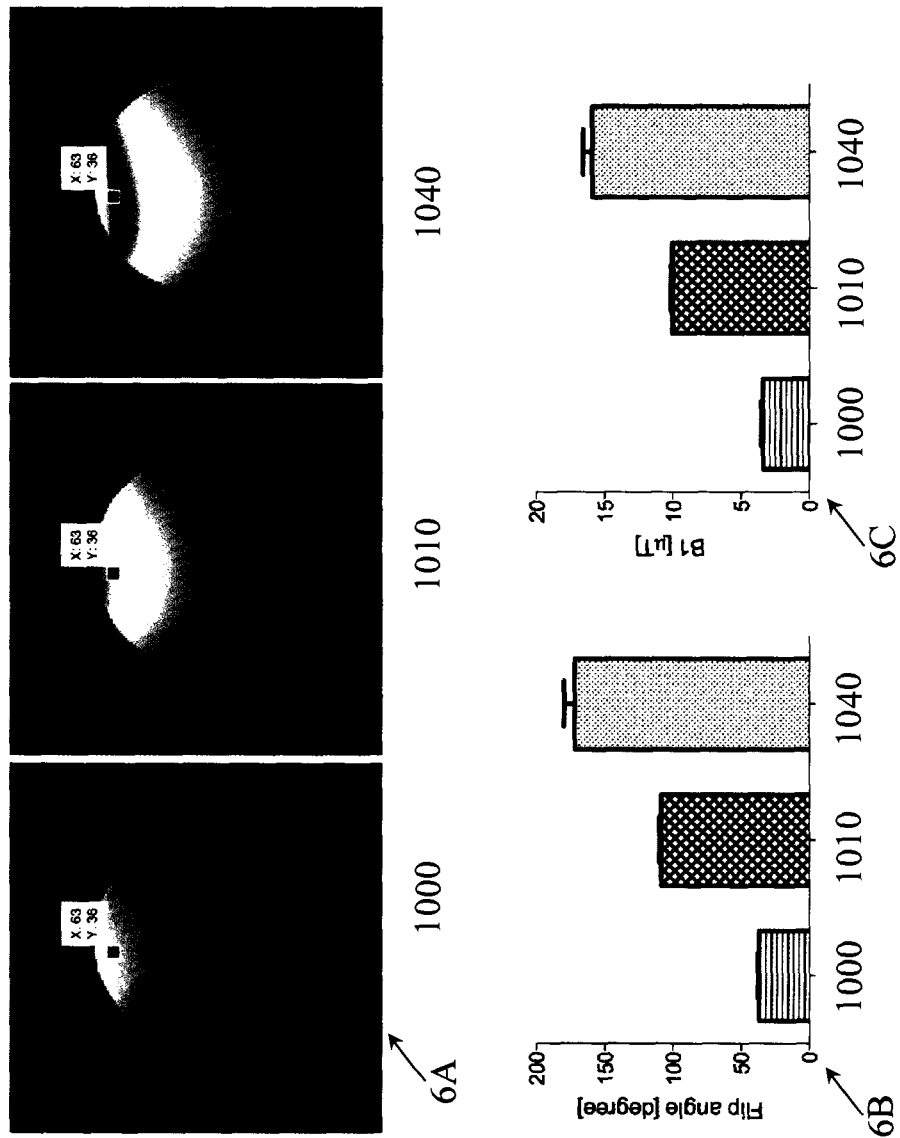
FIG. 6 illustrates GRE (gradient recalled echo) images obtained with the different transmit coils at the same envelope amplitude set by the system's controller. Average flip angle and B1 values were calculated over a 5-pixel region centered at the highlighted pixel on maps obtained through a double angle method (DAM).

FIG. 6(a) shows GRE images of a 2000 ml saline phantom when transmitting RF with the different transmit coils 1000, 1010, and 1040 and receiving signal with the body coil of the scanner. Note that a signal inversion band was possible for coil 1040 at a current level similar to coil 1000 and coil 1010. FIG. 6(b) shows average flip angle and B1 amplitude values at the selected 5-pixel region of interest (ROI). When comparing with bench top results, similar B1 gain was obtained from coil 1010 to coil 1040 and slightly higher B1 gain was obtained from coil 1000 to coil 1010. These images confirm the gain in B1 when driving the different coils with more turns for any given amplifier.

The effective B1 of a current-mode transmit system can be increased by using multi-turn transmit coils. In one embodiment, the multiple-turn design may generate about 3 times the B1 value obtained with a single turn without increasing output current and dissipation on the power MOSFET. This higher efficiency may allow either significantly increased effective power per amplifier, or may allow the use of lower current/power rated MOSFETs with reduced port capacitances, which in turn may improve the overall performance of the on-coil current-mode amplifier. As shown above, the lower output capacitance of the lower power MRF6V2010 allowed a larger impedance over a larger range with reduced modulation of the MOSFETs impedance by $V_{DD}$. This effect should offer advantages in terms of phase modulation and amplifier decoupling. Using this nominally lower power field-effect transistor (FET) in combination with the configuration in coil 1040 facilitates delivering sufficient B1 field for MR imaging even though the nominal power rating of this device is only around 10 W RMS in the 10 MHz to 450 MHz range.

Higher B1/I values reduce the current requirements at a given nominal drain voltage, which in turn facilitates simplifying design specifications and increasing amplifier performance. In addition, increasing B1/I through the multi-turn coil design can minimize heat dissipation on the power MOSFETs, which is significant for truly on-coil amplifier implementations. In general, lower drain current specification for the semiconductor device will also keep $R_{DS\_ON}$ low and closer to its rated value, which should improve power efficiency across the operating current range.

Using a coil with more turns may increase the potential to run up against a voltage limit in the output stage, since the effective load impedance is increased. However, the switch-mode structure of the CMCD is such that each of the FETs is alternatively switched between a high voltage regime and a high current regime, ideally with no overlap between these states. Thus the increase in the voltage seen by the FET does not directly translate into an increase in power dissipated in the device, since ideally no current flows through the FET in this state.

TABLE 1

Table 1 illustrates input impedance of the different transmit coils 1000, 1010, and 1040 connected to a 25 cm coaxial cable and resonated in the loaded condition at 63.66 MHz.

| Coils | $Z_{UNLOADED}$ [Ω] | $Z_{LOADED}$ [Ω]* |
|---|---|---|
| A | 0.9-j 0.4 | 1.7-j 0.2 |
| B | 1.2-j 0.5 | 4.1-j 0.2 |
| C | 2.2 + j 1.3 | 11.7-j 0.3 |

*Loaded with 2000 ml saline through 11 mm spacer.

TABLE 2

Table 2 illustrates current setting for the on-coil current-mode amplifier driving the different coils 1000, 1010, and 1040 at different loading conditions.

| Spacer (mm) | Coils | Z [Ω] | ΣΔ | $I_{DD}$ [A] | $I_{Peak}$ [A] |
|---|---|---|---|---|---|
| 11 | A | $Z_A$ | 0.15 | 8.35 ± 0.18 | 5.32 ± 0.12 |
| 11 | B | $Z_B$ | 0.15 | 8.08 ± 0.24 | 5.14 ± 0.15 |
| 11 | C | $Z_C$ | 0.15 | 8.05 ± 0.46 | 5.12 ± 0.29 |
| 11 | A | $Z_A$ | 0.3 | 16.40 ± 0.26 | 10.44 ± 0.17 |
| 11 | B | $Z_B$ | 0.3 | 16.73 ± 0.85 | 10.65 ± 0.54 |
| 43 | B | $Z_A$ | 0.15 | 8.01 ± 0.20 | 5.10 ± 0.13 |
| 36.5 | C | $Z_B$ | 0.15 | 8.2 ± 0.17 | 5.22 ± 0.11 |

Figure 7:
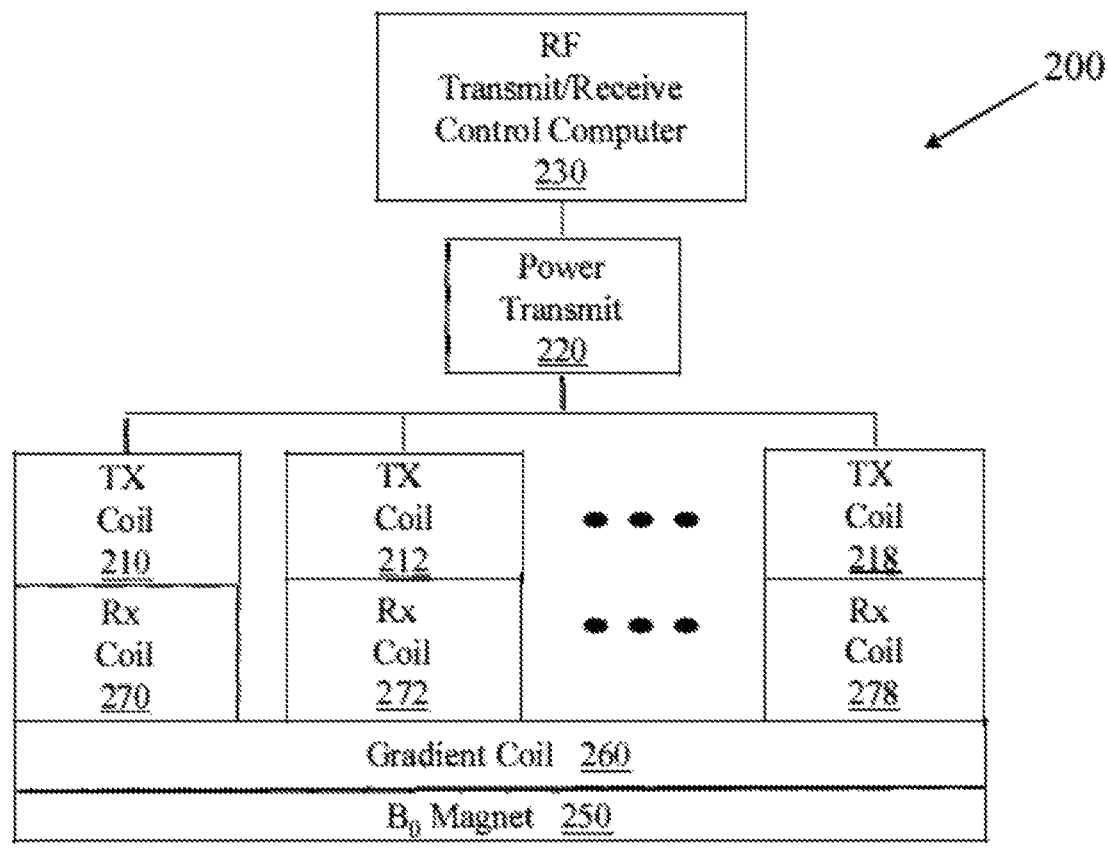
FIG. 7 illustrates portions of a high field parallel MRI apparatus configured with an on-coil switched mode amplifier driving a multi-turn transmit coil.

FIG. 7 illustrates an example system 200 that uses multiple independent multi-turn transmit coils (e.g., 210, 212 . . . 218) and multiple receive coils (e.g., 270, 272 . . . 278). Portions of the multi-turn transmit coils illustrated herein are described in more detail in the '595 patent. The multi-turn transmit coils have on-coil switched mode amplifiers that facilitate improved parallel transmission in MRI. The on-coil switched mode amplifiers described in FIGS. 7-15 may be used with multi-turn coils or with single-turn coils. When operated under similar conditions, the multi-turn coils produce improved (e.g., stronger) B1 without increasing heat dissipation on the amplifiers. The multi-turn transmit coils may be powered by digital controllers 220 (e.g., power transmitters 220) that are controlled by a computer 230. The multi-turn transmit coils may receive a digital signal and produce an analog signal having improved characteristics. The system also includes other standard MRI apparatus elements (e.g., main field magnet 250, gradient coils 260, and so on).

Figure 8:
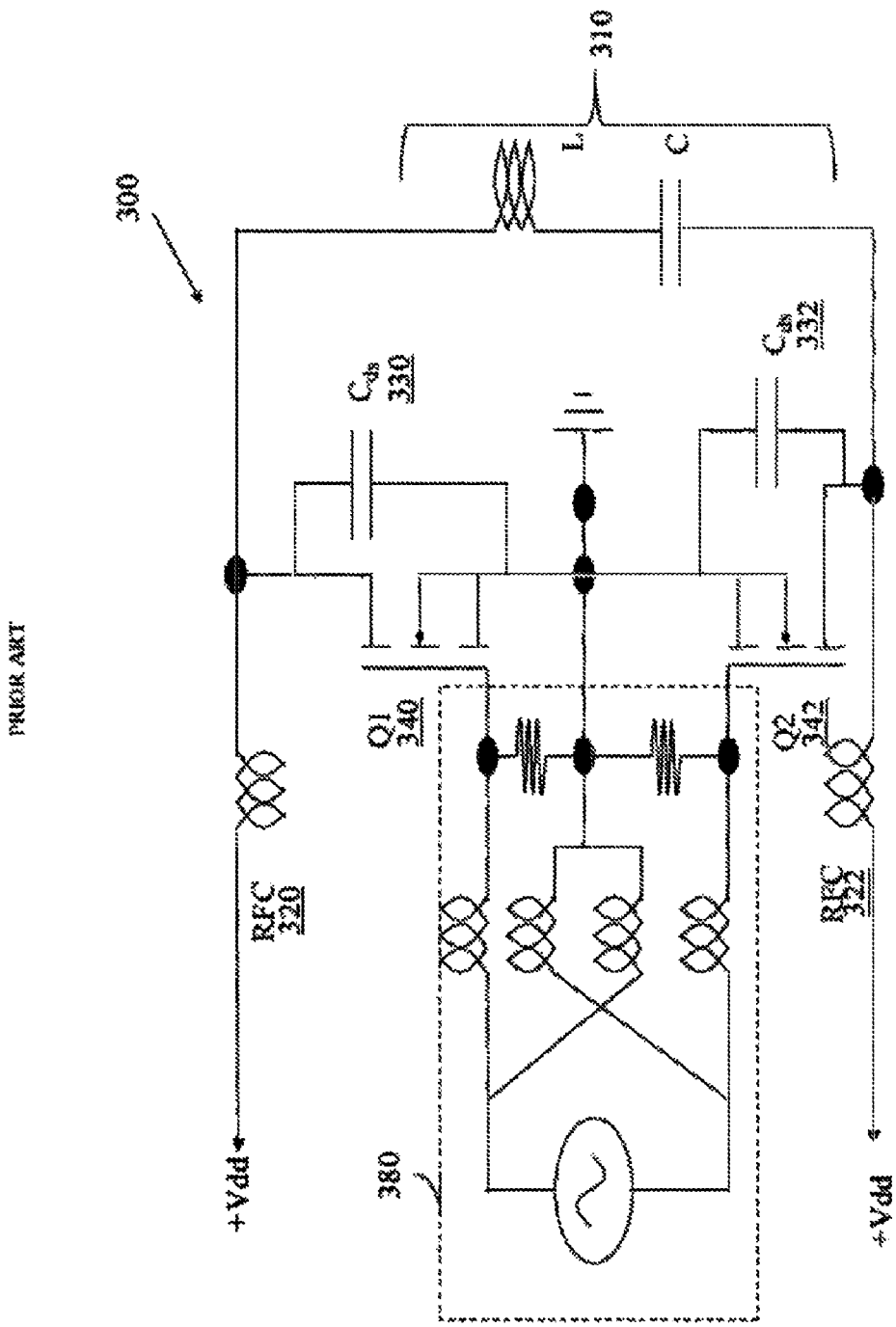
FIG. 8 illustrates a current-mode class-D (CMCD) amplifier topology for use in parallel MRI transmission involving on-coil switched-mode amplification for a multi-turn transmit coil.

FIG. 8 illustrates an example CMCD amplifier topology 300 similar to the CMCD described in the '595 patent. A coil configured with this topology 300 may be referred to as an L-C-switched-mode coil. In the illustration, the multi-turn coil is represented by the series LC leg 310. Example multi-turn coils may have different configurations than the single leg 310. The L refers to inductance in the coil 310 and the C refers to capacitance in the coil 310. The two chokes RFC (e.g., 320, 322) act as current sources. The drain-source capacitances $C_{ds}$ (e.g., 330, 332) are in series with the coil 310. Alternative shunting of an applied DC voltage to ground as an FET is driven to saturation produces excitation at desired RF frequencies. The signal that drives the FETs to saturation is provided by linear circuit 380 that includes an RF transmission unit. The coil 310 terminals are attached between the drains of two FETs (Q1 340, Q2 342) and tuned so that the circuit is series resonant when one of the FETs is switched on.

Figure 9:
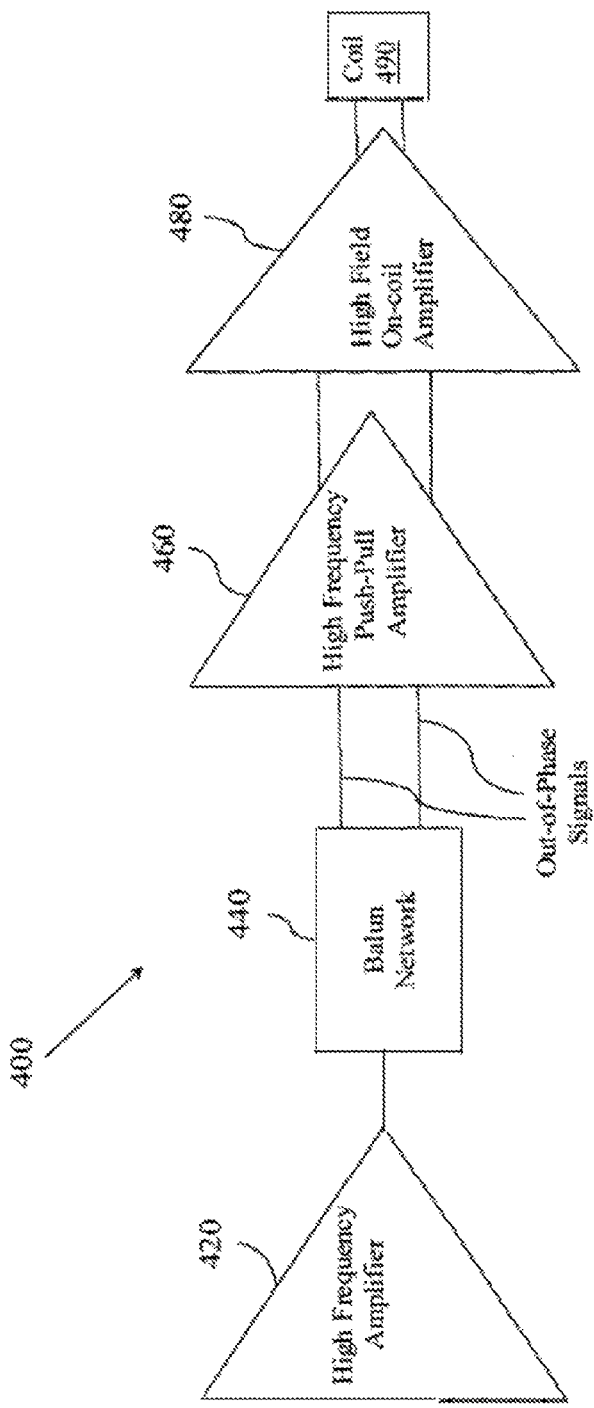
FIG. 9 illustrates a CMCD amplifier topology for use in high field parallel MRI transmission involving a multi-turn transmit coil.

FIG. 9 illustrates a schematic of a topology 400 that is adapted for use with high field MRI systems that include an on-coil CMCD amplifier such as the one described in the '595 patent. The topology 400 includes an RF signal generator (not shown) which may be digitally controlled. The RF signal generator generates a high frequency RF signal (e.g., 300 MHz). The output of the signal generator is amplified through a high frequency amplifier 420.

The output of the high frequency amplifier 420 is fed to a balun network 440 that inputs the RF signal with respect to ground and converts the input RF signal into a pair of first and second balanced out-of-phase signals, with respect to ground, at the high frequency. The balun network 440 can be implemented with types of networks that convert a single input voltage with respect to ground into two balanced 180 degree out-of-phase signals (e.g., wound wire transformers, wavelength-related lengths of transmission line).

The balun network 440 may be implemented using a quarter-wavelength transmission line that has a length substantially equal to an integer multiple of one quarter of the wavelength of the RF signal generated by the signal generator (e.g., n(λ)/4, where n is an integer). The quarter-wavelength transmission line converts the input RF signal into balanced 180 degree out-of-phase signals. In high-field MRIs, where the RF signal will have shorter wavelengths (e.g., approximately 70 cm at 7 T), it becomes feasible to employ a quarter-wavelength transmission line (e.g., 17.5 cm) to generate the out-of-phase signals that are provided to high frequency push-pull amplifier 460 and that are ultimately utilized to drive the on-coil CMCD amplifier 480. Amplifier 480 controls, at least in part, the RF transmitted by multi-turn transmission-coil 490.

Figure 10:
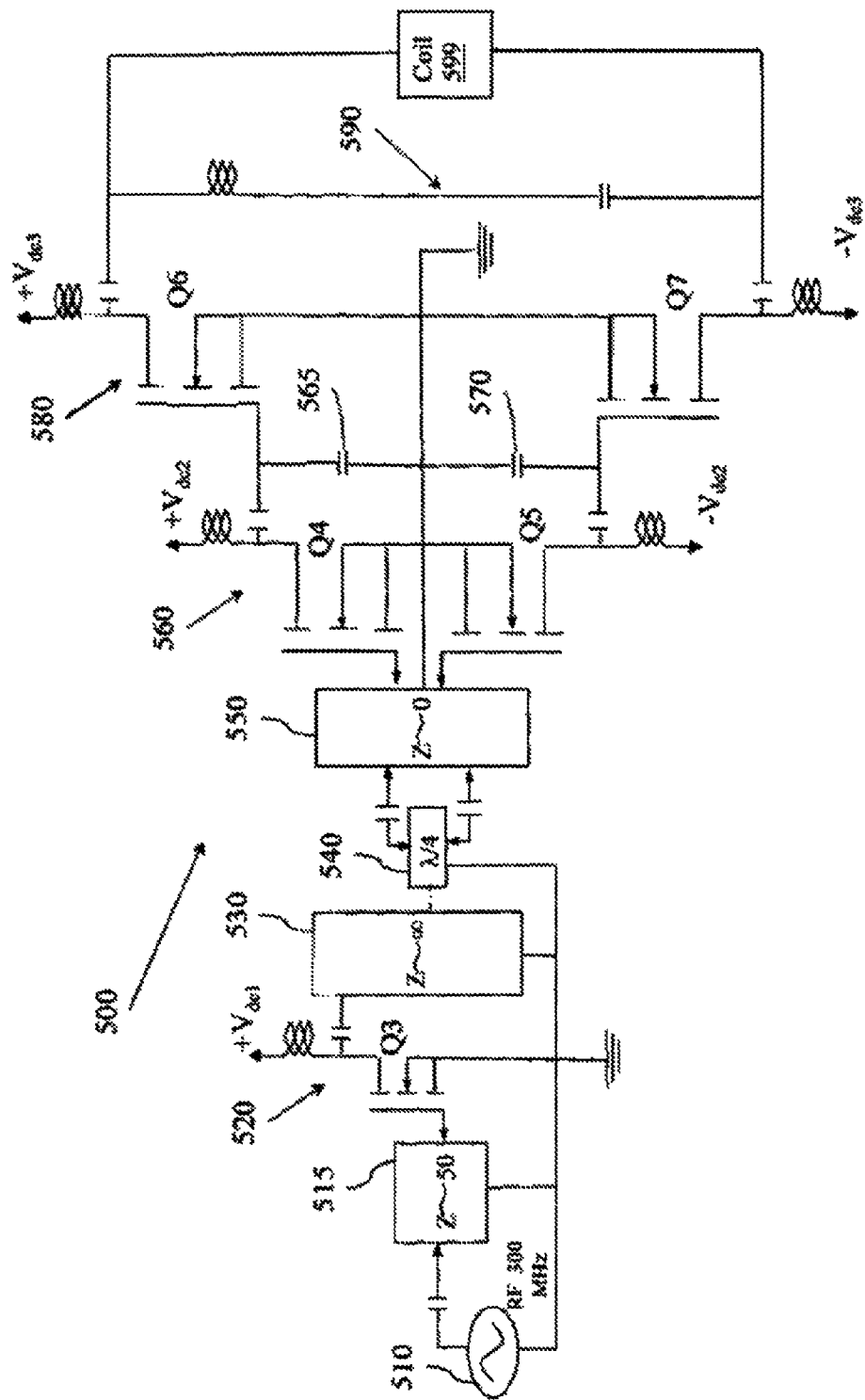
FIG. 10 illustrates a CMCD amplifier topology for use in high field parallel MRI transmission involving a multi-turn transmit coil.

FIG. 10 illustrates a more detailed schematic of an example topology 500 that is adapted for use with 7 T field MRI systems that include an on-coil CMCD amplifier such as the one described in the '595 patent. The coil 599 illustrated on the right of the figure is a multi-turn coil. The topology 500 includes a 300 MHz RF signal generator 510 coupled to a 50 ohm impedance matching network 515. A class A amplifier 520 amplifies the RF signal. In the illustrated topology, the class A amplifier 520 is implemented with a FET Q3 that is connected at its drain to a first DC voltage $V_{dc1}$ and driven by the RF signal applied at its gate. The amplified RF signal is input to a balun network 530 that includes a quarter-wavelength transmission line 540.

In the illustrated topology, the balanced, out-of-phase signals output by the quarter-wavelength transmission line 540 drive a class B push-pull amplifier 560 that boosts the peak voltage of the signal to a voltage $V_{dc2}$ that is sufficient to efficiently switch an on-coil CMCD amplifier 580. The push-pull amplifier 560 includes two FETs Q4, Q5 connected in a common source arrangement with drains connected to gates of FETs Q6, Q7 that are part of the on-coil CMCD amplifier 580. The RF transmitted by multi-turn coil 599 is controlled, at least in part, by amplifier 580.

The topology 500 includes components configured to optimize performance in high field strength applications. For example capacitors 565, 570 connected between the gate and source of the FETs Q6, Q7 are configured to match impedance to higher values and to avoid a dramatic loss of gain from the push-pull amplifier 560. An L-C filter 590 is disposed in parallel between the on-coil CMCD amplifier 580 and the transmit coil 599. The L-C filter 590 is configured to resonate with the parasitic impedance generated by the FETs Q6, Q7 operating at 300 MHz to attenuate harmonics that are typically present with switched mode amplifiers. The L-C filter 590 also provides decoupling from transmitting neighboring coils due to the high impedance seen from the coil at higher frequencies.

Figure 11:
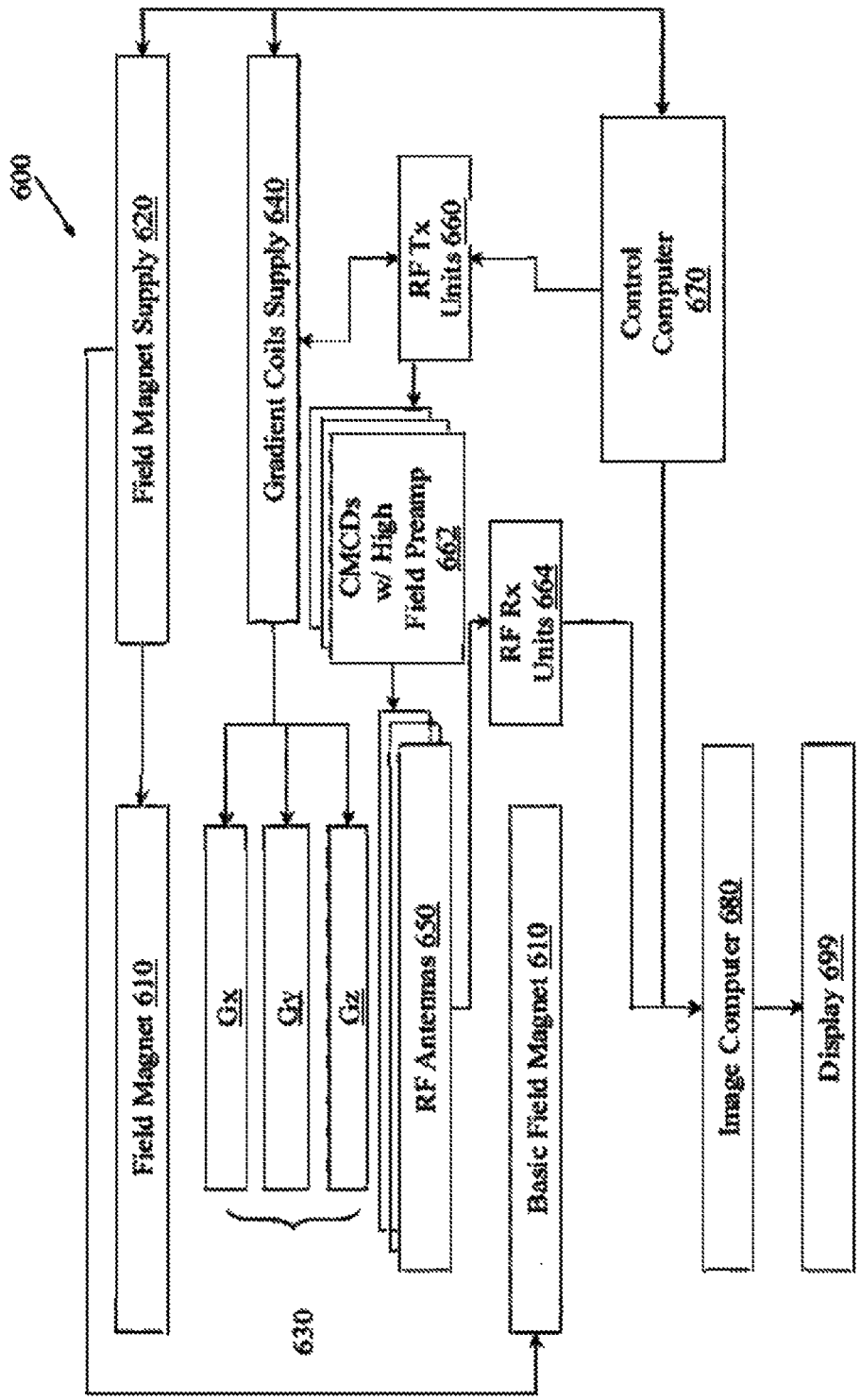
FIG. 11 illustrates a high field MRI apparatus configured with multiple CMCDs with switched mode amplifiers for controlling a multi-turn transmit coil.

FIG. 11 illustrates an example MRI apparatus 600 configured with a set of on-coil switched mode amplifiers 622 to facilitate improved parallel transmission of analog RF signals used in high field MRI systems. The analog RF signals will be transmitted by multi-turn transmit coils. The on-coil switched mode amplifiers may be configured like those illustrated in FIGS. 9-10. The RF antennas 650 may correspond in part to L-C leg 310 (FIG. 8). The CMCDs 662 may correspond in part to CMCD topologies 400, 500. The RF transmission (TX) units 660 may correspond to RF signal generator 510.

The apparatus 600 includes a field magnet(s) 610 that produce a high strength (e.g., 7 T) magnetic field and a field magnet supply 620. Ideally, the field magnets 610 would produce a uniform $B_0$ field. However, in practice, the $B_0$ field may not be uniform, and may vary over an object being imaged by the MRI apparatus 600. MRI apparatus 600 may include gradient coils 630 configured to emit gradient magnetic fields like $G_X$, $G_Y$ and $G_Z$. The gradient coils 630 may be controlled, at least in part, by a gradient coils supply 640. In some examples, the timing, strength, and orientation of the gradient magnetic fields may be controlled, and thus selectively adapted during an MRI procedure.

MRI apparatus 600 may include a set of RF antennas 650 that are configured to generate RF pulses and to receive resulting magnetic resonance signals from an object to which the RF pulses are directed. In one example, the RF antennas 650 may be considered to correspond, at least in part, to element L-C leg 310 (FIG. 8). In some examples, how the pulses are generated and how the resulting MR signals are received may be controlled and thus may be selectively adapted during an MRI procedure. Separate RF transmission and reception-coils can be employed. The RF antennas 650 may be controlled, at least in part, by a set of RF transmission units 660. An RF transmission unit 660 may provide a signal to a CMCD 662, which may manipulate the signal and provide a different signal to an RF antenna 650. The signal may be manipulated (e.g., amplified) according to approaches described above in connection with FIGS. 9-10.

The gradient coils supply 640 and the RF transmission units 660 may be controlled, at least in part, by a control computer 670. In one example, the control computer 670 may be programmed to perform methods like those described herein. The magnetic resonance signals received from the RF antennas 650 can be employed to generate an image, and thus may be subject to a transformation process like a two dimensional FFT that generates pixilated image data. The transformation can be performed by an image computer 680 or other similar processing device. The image data may then be shown on a display 699. While FIG. 11 illustrates an example MRI apparatus 600 that includes various components connected in various ways, it is to be appreciated that other MRI apparatus may include other components connected in other ways.

In one example, MRI apparatus 600 may include control computer 670 and a digital controller operably connected to the CMCDs 662. The CMCDs 662 may include a set of L-C-switched-mode coils operably connected to the digital controller. In one example, a member of the set of L-C-switched-mode coils may be individually controllable by the control computer 670. Additionally, the control computer 670 may provide an L-C-switched-mode coil with a digital control signal and the L-C switched-mode coil may output an analog RF signal based, at least in part, on the digital control signal.

In one example, the set of L-C switched mode coils may be operably connected to the control computer 670 by dedicated connections. The dedicated connections may include a copper cable, a fiber optic cable, a wireless connection, and so on. In one example, the L-C switched-mode coil may be operably connected to a local memory that stores bit patterns that control production of the analog RF signal. Thus, the digital control signal may identify a stored bit pattern.

Figure 12:
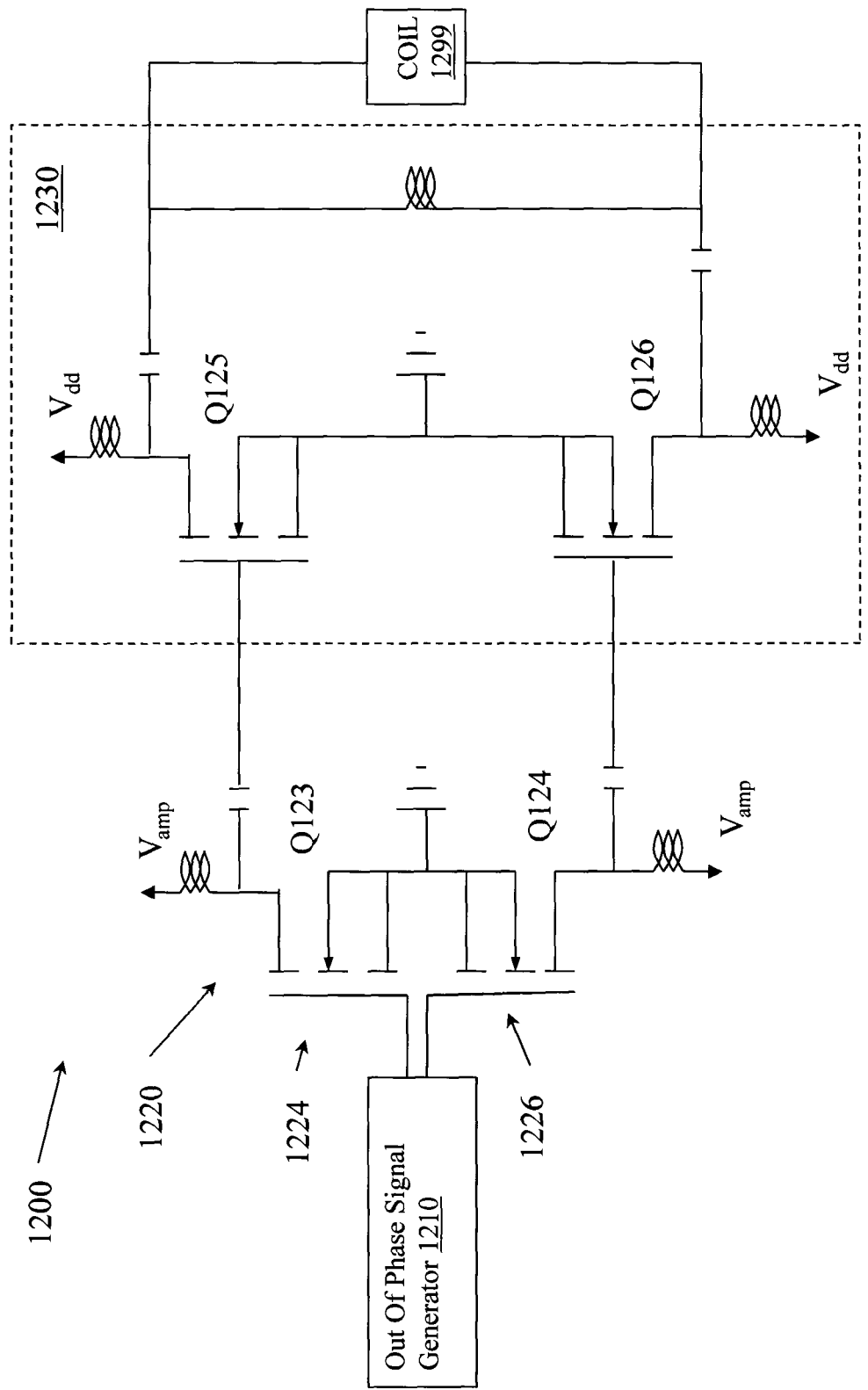
FIG. 12 illustrates a CMCD amplifier topology for use in parallel MRI transmission including voltage mode class-D (VMCD) pre-amplifiers for controlling a multi-turn transmit coil.

FIG. 12 illustrates an example CMCD topology 1200 that includes an out-of-phase signal generator 1210 and a switched voltage-mode class-D (VMCD) pre-amplification stage 1220 that pre-amplifies signals provided to an on-coil CMCD amplifier 1230. Amplifier 1230 controls, at least in part, RF transmitted by multi-turn coil 1299.

The out-of-phase signal generator 1210 generates two out-of-phase RF signals and can be implemented in different ways, one of which will be described below with reference to FIGS. 13 and 15. The pre-amplification stage 1220 includes first and second VMCD amplifiers 1224, 1226 that are configured to amplify one of the out-of-phase RF signals. In the described embodiment, the first and second VMCD amplifiers include FETs Q123 and Q124 which can be MOSFETs or other suitable switch devices. The first and second VMCD amplifiers 1224 and 1226 drive one of the CMCD FETs by selectively providing a pre-amplifier voltage ($V_{amp}$) to a gate of the driven CMCD FET. The switched mode pre-amplification stage 1220 is configured to boost the out-of-phase RF signals from the out-of-phase signal generator 1210 to a voltage level that will efficiently switch the CMCD FETs.

Figure 13:
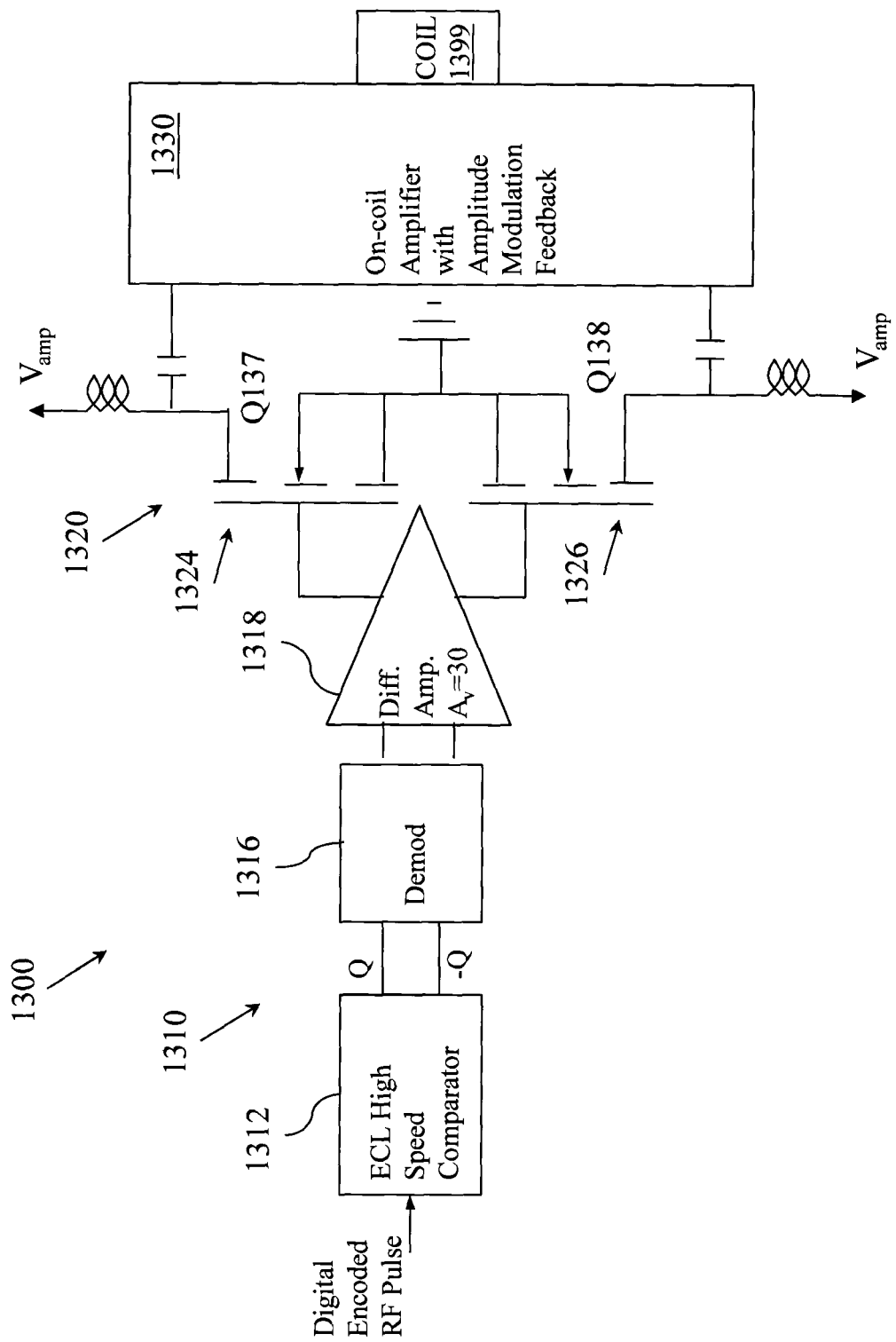
FIG. 13 illustrates a CMCD amplifier topology for use with a multi-turn transmit coil in parallel MRI transmission including VMCD pre-amplifiers.

FIG. 13 illustrates a CMCD topology 1300 that includes a pre-amplification stage 1320 similar to the pre-amplification stage 1220 of FIG. 12. The pre-amplification stage includes first and second VMCD amplifiers 1334, 1326 that drive an on-coil CMCD amplifier 1330 similar to on-coil amplifier 1230 and shown schematically in block form for simplicity. Amplifier 1330 and pre-amplifier 1320 control, at least in part, the RF produced by multi-turn coil 1399. The topology 1300 is configured to be driven by a digital encoded RF pulse. The encoded RF pulse is amplified and split into two out-of-phase signals (Q and −Q) through a high speed Emitter Coupled Logic (ECL) comparator 1312. The out-of-phase signals are demodulated through a band pass filter 1316 and further amplified through a differential amplifier 1318. The differential amplifier 1318 may include a cascade of high-speed differential amplifiers. The demodulated and amplified out-of-phase signals are further amplified by the pre-amplification stage 1320 and after pre-amplification have sufficient strength to drive the on-coil CMCD amplifier 1330.

In one embodiment, a 0.8V peak to peak digital encoded RF pulse is transformed through the pre-amplification stage (with a $V_{amp}$ of 28V) to a 55 V peak to peak signal, which, in many instances, will be sufficient to efficiently switch the on-coil CMCD amplifier 1330. Due to the switched mode operation of the pre-amplification stage 1320, the CMCD amplifier 1330 may need to include additional components to provide amplitude modulation for its output RF signal, as will be described in more detail below.

Figure 14:
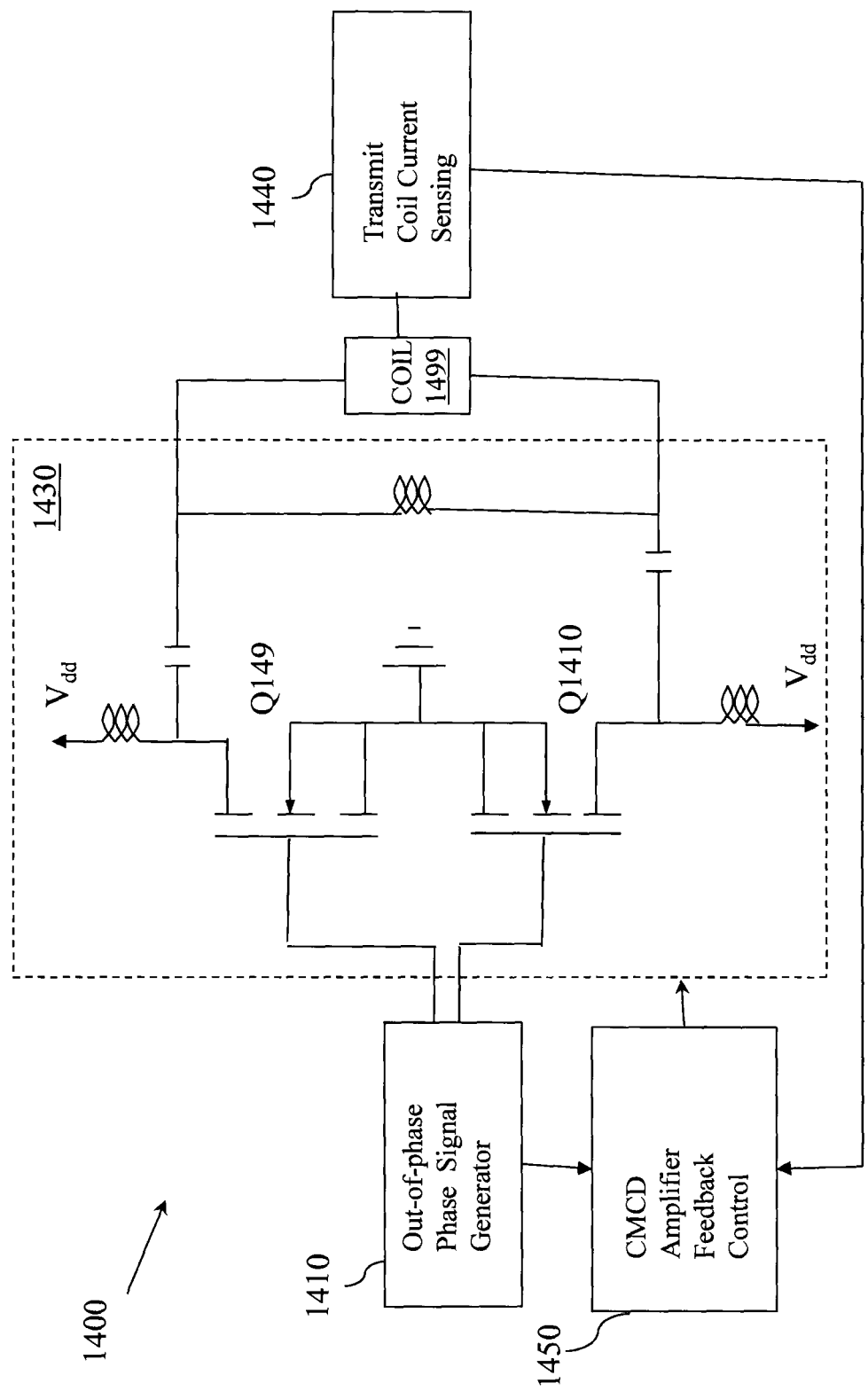
FIG. 14 illustrates a CMCD amplifier topology for use with a multi-turn transmit coil in parallel MRI transmission including feedback control.

FIG. 14 illustrates a CMCD topology 1400 that includes an on-coil CMCD amplifier 1430 similar to CMCD amplifiers 1230 and 1330 (FIGS. 12 and 13). The CMCD amplifier 1430 includes an amplitude modulation system that uses feedback to modulate the amplitude of the RF signal output by the CMCD amplifier 1430. The CMCD amplifier 1430 is driven by an out-of-phase signal generator 1410 that provides switching voltages of sufficient strength to efficiently switch CMCD FETs Q149, Q1410. The signals from the out-of-phase signal generator 1410 are generated based on an input RF pulse having a desired frequency. To achieve sufficient switching voltages, the out-of-phase signal generator 1410 may include a pre-amplification stage similar to the pre-amplification stages 1220, 1320 (FIGS. 12 and 13) as well as a signal generator similar to the signal generator 1310 (FIG. 13). Amplifier 1430 controls, at least in part, the RF transmitted by multi-turn coil 1499.

The topology 1400 includes a CMCD amplifier feedback controller 1450 to modulate the amplitude of the output signal of the on-coil CMCD amplifier 1430. The feedback controller 1450 receives signals indicative of a transmit coil current from a transmit coil current sensing unit 1440. The feedback controller 1450 also receives signals indicative of the input RF pulse from the out-of-phase signal generator 1410. The feedback controller 1450 compares the signals indicative of the transmit coil current to the signals indicative of the input RF pulse and modulates an amplitude of the output of the CMCD amplifier 1430 based, at least in part, on this comparison.

Figure 15:
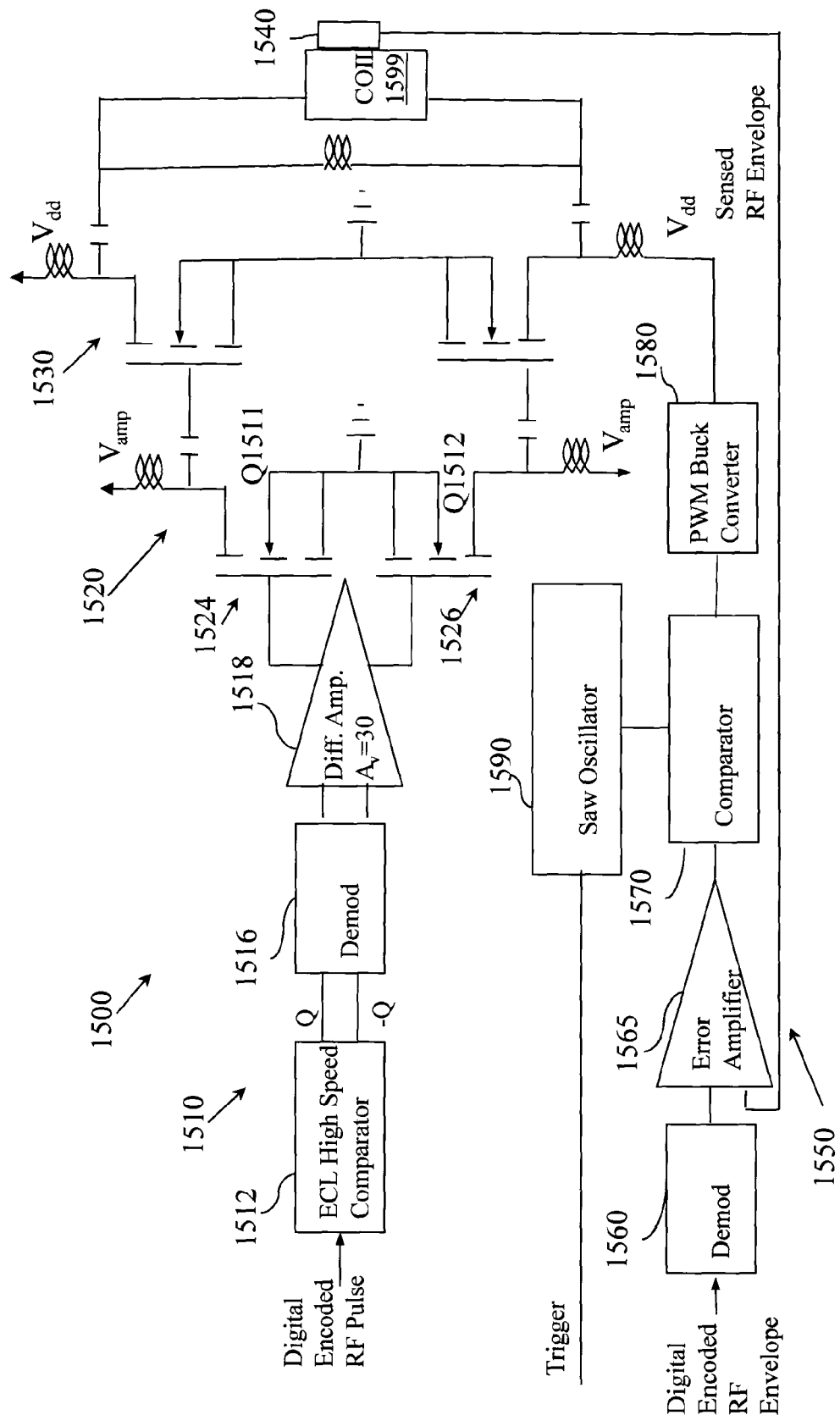
FIG. 15 illustrates a CMCD amplifier topology for use with a multi-turn transmit coil in parallel MRI transmission including VMCD amplifiers and feedback control.

FIG. 15 illustrates a CMCD amplifier topology 1500 that includes an on-coil CMCD amplifier 1530 similar to CMCD amplifier 1430 (FIG. 14) and an out-of-phase signal generator 1510 similar to the out-of-phase signal generator 1310 of FIG. 13 and a VMCD pre-amplification stage 1520 similar to the VMCD pre-amplification stages 1220, 1320 of FIGS. 12 and 13, respectively. Coil 1599 is a multi-turn coil. The pre-amplification stage 1520 includes first and second VMCD amplifiers 1524, 1526 that drive an on-coil CMCD amplifier 1530 similar to on-coil amplifiers 1230 and 1430 (FIGS. 12 and 14).

The topology 1500 is configured to be driven by a digital encoded RF pulse. The encoded RF pulse is amplified and split into two out-of-phase signals (Q and −Q) through a high speed Emitter Coupled Logic (ECL) comparator 1512. The out-of-phase signals are demodulated through a band pass filter 1516 and further amplified through a differential amplifier 1518. The differential amplifier 1518 may include a cascade of high-speed differential amplifiers. The demodulated and amplified out-of-phase signals are further amplified by the pre-amplification stage 1520 and after pre-amplification have sufficient strength to drive the on-coil CMCD amplifier 1530.

The topology 1500 includes a feedback controller 1550 similar to the feedback controller 1450 of FIG. 14. The feedback controller 1550 modulates the amplitude of the output signal from the on-coil CMCD amplifier 1530 based on the envelope of the input digital encoded pulse as compared to the envelope of the current flowing in the transmit coil. The feedback controller 1550 includes a demodulator that demodulates a signal indicative of an envelope of the digital encoded RF pulse and inputs the envelope to an error amplifier 1565. A current envelope sensor 1540 is coupled to the multi-turn transmit coil 1599 and provides an envelope of the transmit coil current to an error amplifier 1565. The current envelope sensor 1540 may be implemented by coupling a wire loop to the multi-turn transmit coil 1599 and passing the demodulated signal through a low-pass filter with a cutoff frequency below the coil resonant frequency (e.g., 63.6 MHz at 1.5 T field strength).

An output of the error amplifier 1565 is provided to a comparator 1570. The comparator 1570 combines the output of the error amplifier with an output of a saw oscillator 1590 and thus acts as an oscillator to generate a pulse width modulated (PWM) signal based on the comparison of the input RF signal envelope and the envelope of the transmit coil current. This PWM signal is used to control a modified buck converter 1580 connected to the power stage for the CMCD amplifier. The buck converter 1580 modulates the amplitude of the RF signal output by the CMCD amplifier 1530. A trigger signal is sent to the saw oscillator 1590 to avoid any false switching when no RF pulse is present. In this manner, the feedback controller 1550 modulates an amplitude of the output of the CMCD amplifier 1530 based, at least in part, on a comparison between envelopes of the input RF pulse and the transmit coil current. Sensing and comparing signal envelopes rather than sensing and comparing the signals themselves is less complex, which facilitates topology 1500 providing improved performance over other systems.

One example apparatus includes a multi-turn transmit surface coil that is configured to transmit a radio frequency (RF) signal at a frequency selected to create nuclear magnetic resonance (NMR) in a material in an object exposed to the RF signal during high field parallel magnetic resonance imaging (MRI). The multi-turn transmit surface coil may have two or more turns. In one embodiment, the multi-turn transmit surface coil has two turns that are both printed on a single board. In another embodiment, the multi-turn transmit surface coil has four turns. Two of the four turns are printed on a first board and two of the four turns are printed on a second board. Other embodiments may have different numbers of turns or different numbers of boards.

In one embodiment, the apparatus may include an on-coil CMDC amplifier configured to drive the multi-turn transmit surface coil. The multi-turn transmit surface coil provides superior performance over a single turn coil. For example, under the same operating conditions (e.g., current, voltage, frequency) and driven by the same on-coil CMCD, the multi-turn transmit surface coil will produce a B1 field at least twice as strong as a B1 field produced by a single turn transmit surface coil. The superior performance extends to heat dissipation. For example, under the same conditions, the multi-turn transmit surface coil produces the at least twice as strong B1 field without increasing heat dissipation by the on-coil current-mode class-D amplifier.

In one example, an apparatus may include a multi-turn transmit surface coil configured for high field parallel MRI. The multi-turn transmit surface coil is configured to be driven by a high frequency (e.g., at least 250 MHz) RF signal generator that generates an RF signal at a high frequency. A balun network inputs the RF signal with respect to ground and converts the input RF signal into a pair of first and second balanced out-of-phase signals with respect to ground at the high frequency. A push-pull amplifier comprising a first FET driven by the first out-of-phase signal and a second FET driven by the second out-of-phase signal provides signals to the multi-turn transmit surface coil. The first and second FETs are connected in a push pull configuration. In one embodiment, the first and second FETs switch an on-coil CMCD amplifier that includes two CMCD FETs that drive an inductance-capacitance (L-C) leg to control production of an RF signal at the high frequency by the multi-turn transmit surface coil.

To the extent that the term "or" is employed in the detailed description or claims (e.g., A or B) it is intended to mean "A or B or both". The term "and/or" is used in the same manner, meaning "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

What is claimed is:

1. An apparatus, comprising:
a multi-turn transmit surface coil configured to transmit a radio frequency (RF) signal at a frequency selected to create nuclear magnetic resonance (NMR) in a material in an object exposed to the RF signal during high field parallel magnetic resonance imaging (MRI), the high field being at least 3 Tesla; and
a current-mode amplifier configured to drive the multi-turn transmit surface coil with load insensitivity during the high field parallel MRI.

2. The apparatus of claim 1, where the multi-turn transmit surface coil comprises two turns.

3. The apparatus of claim 2, where the two turns are both printed on a single board.

4. The apparatus of claim 1, where the multi-turn transmit surface coil comprises four turns.

5. The apparatus of claim 4, where the multi-turn transmit surface coil is printed on two boards, where a first two of the four turns are printed on a first of the two boards and where a different second two of the four turns are printed on a second of the two boards.

6. The apparatus of claim 1, wherein the current-mode amplifier comprises an on-coil current-mode class-D (CMCD) amplifier configured to drive the multi-turn transmit surface coil.

7. The apparatus of claim 1, where the apparatus is configured to produce a 15 µT field from a 1 A current in the multi-turn transmit surface coil.

8. The apparatus of claim 1, where the apparatus is configured to cause B1/I to exceed 15 µT/A in the multi-turn transmit surface coil, where I is current.

9. The apparatus of claim 6, where the multi-turn transmit surface coil, when driven by the on-coil current-mode class-D amplifier, produces a B1 field at least twice as strong as a B1 field produced by a single turn transmit surface coil when driven by the on-coil current-mode class-D amplifier under the same operating conditions, where the operating conditions include frequency, voltage, or current.

10. The apparatus of claim 9, where the multi-turn transmit surface coil, when driven by the on-coil current-mode class-D amplifier, produces the at least twice as strong B1 field without increasing heat dissipation by the on-coil current-mode class-D amplifier under the same operating conditions.

11. The apparatus of claim 1, further comprising:
a high frequency radio frequency (RF) signal generator to generate an RF signal at a high frequency of at least 250 MHz;
a balun network that inputs the RF signal with respect to ground and converts the input RF signal into a pair of first and second balanced out-of-phase signals with respect to ground at the high frequency; and
a push-pull amplifier comprising a first field effect transistor (FET) driven by the first out-of-phase signal and a second FET driven by the second out-of-phase signal, the first and second FETs being connected in a push pull configuration;
where the first and second FETs switch an on-coil current-mode class-D (CMCD) amplifier that includes two CMCD FETs that drive an inductance-capacitance (L-C) leg to control production of an RF signal at the high frequency by the multi-turn transmit surface coil.

12. The apparatus of claim 11, where the balun network comprises a quarter-wavelength transmission line having a length corresponding to an integer multiple of one quarter-wavelength of the high frequency RF signal, the transmission line being electrically connected to the RF signal generator to output the pair of balanced out-of-phase signals, or where the balun network comprises wound wire transformer electrically connected to the RF signal generator to output the pair of balanced out-of-phase signals.

13. The apparatus of claim 11, where the high frequency is at least 300 MHz and the high field parallel magnetic resonance imaging is performed with a base magnetic field of at least 7 Tesla.

14. The apparatus of claim 11, further comprising:
an L-C filter connected in parallel between the on-coil CMCD and the multi-turn transmit surface coil, the L-C filter being configured to resonate with an output parasitic impedance of CMCD FETs in the on-coil amplifier at the high frequency;
capacitors connected between a gate and source of the CMCD FETs, the capacitors being configured to increase input impedance with respect to the on-coil CMCD amplifier; and
a class A amplifier disposed between the RF signal generator and the balun network to amplify the output of the RF signal generator.

15. The apparatus of claim 1, further comprising:
a control apparatus comprising:
a high frequency radio frequency (RF) signal generator to generate an RF signal at a high frequency of at least 300 MHz;
a balun network electrically connected to the RF signal generator to output a pair of first and second balanced out-of-phase signals at the high frequency; and
a push-pull amplifier comprising a first field effect transistor (FET) driven by the first out-of-phase signal and a second FET driven by the second out-of-phase signal, the first and second FETs being connected in a push pull configuration;
where an L-C-switched-mode coil is controlled by an output of the push pull amplifier to output an analog RF signal at the desired frequency,
where transmissions from the transmit surface coil are controlled by the control apparatus.

16. The apparatus of claim 15, where the balun network comprises a quarter-wavelength transmission line having a length corresponding to an integer multiple of one quarter-wavelength of the high frequency RF signal, the transmission line electrically connected to the RF signal generator to output a pair of first and second balanced out-of-phase signals at the high frequency, or where the balun network comprises a wound wire transformer electrically connected to the RF signal generator to output a pair of first and second balanced out-of-phase signals at the high frequency.

17. The apparatus of claim 15, comprising an L-C filter connected in parallel between an on-coil CMCD amplifier and the multi-turn transmit coil that make up the L-C switched mode coil, the L-C filter being configured to resonate with an output parasitic impedance of FETs in the on-coil CMCD amplifier at the high frequency.

18. The apparatus of claim 15, where the transmit surface coil comprises two turns, where the two turns are both printed on a single board.

19. The MRI of claim 15, where the transmit surface coil comprises four turns, and where the transmit surface coil is printed on two boards, where a first two of the four turns are printed on a first of the two boards and where a different second two of the four turns are printed on a second of the two boards.

20. The apparatus of claim 15, where the transmit surface coil, when driven by the control apparatus, produces a B1 field at least twice as strong as a single turn transmit surface coil driven by the control apparatus under matching operating conditions, where the operating conditions include frequency, voltage, or current.

21. The apparatus of claim 20, where the transmit surface coil, when driven by the control apparatus, produces the at least twice as strong B1 field without increasing heat dissipation by the control apparatus under matching operating conditions.

\* \* \* \* \*